(12) United States Patent
Wang et al.

(10) Patent No.: US 11,183,665 B2
(45) Date of Patent: Nov. 23, 2021

(54) DISPLAY SUBSTRATE AND METHOD FOR MAKING THE SAME, DISPLAY APPARATUS

(71) Applicant: BOE TECHNOLOGY GROUP CO., LTD., Beijing (CN)

(72) Inventors: Tao Wang, Beijing (CN); Tao Sun, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/615,110

(22) PCT Filed: May 7, 2019

(86) PCT No.: PCT/CN2019/085870
§ 371 (c)(1),
(2) Date: Nov. 19, 2019

(87) PCT Pub. No.: WO2019/214620
PCT Pub. Date: Nov. 14, 2019

(65) Prior Publication Data
US 2020/0176711 A1    Jun. 4, 2020

(30) Foreign Application Priority Data

May 9, 2018    (CN) .......................... 201810440204.5

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/3244* (2013.01); *H01L 51/001* (2013.01);
(Continued)

(58) Field of Classification Search
CPC ............. H01L 51/5253; H01L 27/3244; H01L 51/448; H01L 51/5237
See application file for complete search history.

(56) References Cited

U.S. PATENT DOCUMENTS

| 10,205,122 B2 | 2/2019 | Choi et al. |
| 2002/0113549 A1* | 8/2002 | Yamazaki .......... H01L 51/5259 |
| | | 313/506 |

(Continued)

FOREIGN PATENT DOCUMENTS

| CN | 101599500 A | 12/2009 |
| CN | 103855185 A | 6/2014 |

(Continued)

OTHER PUBLICATIONS

Chinese Notification to Grant Patent Right for Invention dated Dec. 30, 2019, from application No. 201810440204.5.
(Continued)

*Primary Examiner* — Feifei Yeung Lopez
(74) *Attorney, Agent, or Firm* — Thomas | Horstemeyer, LLP

(57) ABSTRACT

There is provided a display substrate, a manufacturing method thereof, and a display device, relating to the field of display technology. The display substrate includes: a base substrate; a self-luminescent layer disposed on a side of the base substrate; and an encapsulation film layer disposed on a side of the self-luminescent layer away from the base substrate. The display substrate has a gap, which penetrates through the self-luminescent layer and the encapsulation film layer, and separates the self-luminescent layer and the encapsulation film layer into at least two parts with a part corresponding to a to-be-perforated area of the display substrate and another part corresponds to a non-perforated area of the display substrate other than the to-be-perforated area. The edge of the encapsulation film layer adjacent to the
(Continued)

gap covers the side surface of the edge of the self-luminescent layer adjacent to the gap.

18 Claims, 9 Drawing Sheets

(51) Int. Cl.
  *H01L 51/00* (2006.01)
  *H01L 51/56* (2006.01)
  *H01L 51/44* (2006.01)

(52) U.S. Cl.
  CPC ........ *H01L 51/0018* (2013.01); *H01L 51/448* (2013.01); *H01L 51/5237* (2013.01); *H01L 51/56* (2013.01); *H01L 2227/323* (2013.01); *H01L 2251/566* (2013.01)

(56) References Cited

U.S. PATENT DOCUMENTS

| | | | |
|---|---|---|---|
| 2017/0047544 A1* | 2/2017 | Kang | ................... H01L 51/0096 |
| 2017/0148856 A1 | 5/2017 | Choi et al. | |
| 2017/0162111 A1* | 6/2017 | Kang | ................... H01L 27/3276 |
| 2018/0069063 A1* | 3/2018 | Kim | ................... G02F 1/133345 |

FOREIGN PATENT DOCUMENTS

| | | |
|---|---|---|
| CN | 106783881 A | 5/2017 |
| CN | 106887523 A | 6/2017 |
| CN | 107799659 A | 3/2018 |
| CN | 107808896 A | 3/2018 |
| CN | 108417731 A | 8/2018 |

OTHER PUBLICATIONS

Chinese Office Action dated Jul. 26, 2019, from application No. 201810440204.5.
International Search Report and Written Opinion dated Jul. 30, 2019, from application No. PCT/CN2019/085870.

* cited by examiner

DISPLAY SUBSTRATE AND METHOD FOR MAKING THE SAME, DISPLAY APPARATUS

CROSS-REFERENCE TO RELATED APPLICATIONS

This application is based upon International Application No. PCT/CN2019/085870, filed on May 7, 2019, which is based upon and claims the priority of the Chinese Patent Application No. 201810440204.5, entitled "Thin Film Encapsulation Structure and Encapsulation Method thereof, OLED Display Device", filed with the Chinese Patent Office on May 9, 2018, the entire contents of which are hereby incorporated by reference.

TECHNICAL FIELD

The present disclosure relates to the field of display technologies, in particular, relates to a display substrate, a manufacturing method thereof, and a display device.

BACKGROUND

Organic Light Emitting Device (OLED) is a display lighting device that has been developed in recent years. It has the advantages of high response, high contrast, flexibility, and the like, and has broad application prospects.

SUMMARY

In an aspect, there is provided a display substrate. The display substrate includes a base substrate, a self-luminescent layer disposed on a side of the base substrate, and an encapsulation film layer disposed on a side of the self-luminescent layer away from the base substrate. The display substrate has a gap, which penetrates through the self-luminescent layer and the encapsulation film layer, and separates the self-luminescent layer and the encapsulation film layer into at least two parts with a part corresponding to a to-be-perforated area of the display substrate and another part corresponding to a non-perforated area of the display substrate other than the to-be-perforated area. An edge of the encapsulation film layer adjacent to the gap covers a side surface of an edge of the self-luminescent layer adjacent to the gap.

In some arrangements, the encapsulation film layer includes a first inorganic barrier layer, an organic barrier layer and a second inorganic barrier layer, which are sequentially disposed on the side of the self-luminescent layer away from the base substrate. An edge of the first inorganic barrier layer adjacent to the gap covers the side surface of the edge of the self-luminescent layer adjacent to the gap. An edge of the second inorganic barrier layer adjacent to the gap covers a side surface of an edge of the organic barrier layer adjacent to the gap.

In some arrangements, a width of a side of the gap adjacent to the base substrate is smaller than a width of a side of the gap away from the base substrate.

In some arrangements, a portion of a cross section of the gap adjacent to the base substrate is a trapezoidal shape, and a width of a side of the trapezoidal shape adjacent to the base substrate is smaller than a width of a side of the trapezoidal shape away from the base substrate. The cross section of the gap is a cross section obtained by cutting the gap along a width direction of the gap and a direction perpendicular to the base substrate.

In some arrangements, an angle between a side of the trapezoidal shape and a bottom side of the trapezoidal shape adjacent to the base substrate is 100° to 150°.

In some arrangements, an orthogonal projection of the gap on the base substrate extends along a peripheral contour of the to-be-perforated area.

In some arrangements, the display substrate further includes a thin film transistor structure layer disposed between the base substrate and the self-luminescent layer. A side of the gap adjacent to the base substrate exposes a surface of the thin film transistor structure layer. Alternatively, the gap penetrates through the thin film transistor structure layer to expose a surface of the base substrate, and separates the thin film transistor structure layer into at least two parts with a part corresponding to the to-be-perforated area and another part corresponding to the non-perforated area, and the edge of the encapsulation film layer adjacent to the gap covers a side surface of an edge of the thin film transistor structure layer adjacent to the gap.

In another aspect, there is provided a display substrate after cutting, obtained by cutting the display substrate according to any of the above arrangements along the gap of the display substrate. The display substrate includes a base substrate, a self-luminescent layer disposed on a side of the base substrate, and an encapsulation film layer disposed on a side of the self-luminescent layer away from the base substrate. The display substrate after cutting has a hole, which at least penetrates through the encapsulation film layer and the self-luminescent layer, and an edge of the encapsulation film layer adjacent to the hole covers a side surface of an edge of the self-luminescent layer adjacent to the hole.

In yet another aspect, there is provided a manufacturing method of a display substrate. The method includes providing a base substrate. The method includes forming a partition member on a side of the base substrate. An orthogonal projection of the partition member on the base substrate extends along a peripheral contour of a to-be-perforated area of the display substrate, and a width of a side of the partition member adjacent to the base substrate is smaller than a width of a side of the partition member away from the base substrate. The method includes forming a self-luminescent layer on a side of the base substrate on which the partition member is formed. The self-luminescent layer is separated by the partition member into at least two parts with a part being in the to-be-perforated area and another part being in a non-perforated area of the display substrate other than the to-be-perforated area. The method includes forming an encapsulation film layer on a side of the self-luminescent layer away from the base substrate, and removing the partition member and film material adhered to a surface of the partition member to form a gap penetrating through the self-luminescent layer and the encapsulation film layer.

In some arrangements, forming a partition member on a side of the base substrate includes forming a negative photoresist layer on the base substrate, exposing an area of the negative photoresist layer where the partition member is to be formed, and developing the negative photoresist layer exposed to form the partition member.

In some arrangements, a cross section of the partition member is a trapezoidal shape, and the cross section of the partition member is a cross section obtained by cutting the partition member along a width direction of the partition member and a direction perpendicular to the base substrate.

In some arrangements, a difference between a width of a side of the partition member away from the base substrate and a width of a side of the partition member adjacent to the base substrate is greater than or equal to 0.5 μm.

In some arrangements, the partition member has a height of 1 μm to 10 μm.

In some arrangements, forming an encapsulation film layer on a side of the self-luminescent layer away from the base substrate includes forming a first inorganic barrier layer on the side of the self-luminescent layer away from the base substrate, the first inorganic barrier layer covering a side surface of an edge of the self-luminescent layer adjacent to the partition member, forming an organic barrier layer on a side of the first inorganic barrier layer away from the base substrate, the organic barrier layer being located in an area of the display substrate other than the area where the partition member is located, and forming a second inorganic barrier layer on a side of the organic barrier layer away from the base substrate, the second inorganic barrier layer covering a side surface of an edge of the organic barrier layer adjacent to the partition member.

In some arrangements, the self-luminescent layer is formed by an evaporation process, and the first inorganic barrier layer and the second inorganic barrier layer are formed by a chemical vapor deposition process.

In some arrangements, before forming a partition member on a side of the base substrate, the method further includes forming a thin film transistor structure layer on a side of the base substrate. The partition member is formed on a side of the thin film transistor structure layer away from the base substrate. Alternatively, after forming a partition member on a side of the base substrate, the method further includes forming a thin film transistor structure layer on a side of the base substrate on which the partition member is formed. The thin film transistor structure layer is separated into at least two parts with a part being located in the to-be-perforated area and another part being located in the non-perforated area of the display substrate other than the to-be-perforated area.

In still another aspect, there is provided a display device including the display substrate according to any of the above arrangements, or the display substrate after cutting according to any of the above arrangements.

DETAILED DESCRIPTION

The technical solutions in some arrangements of the present disclosure are described below with reference to the accompanying drawings. Apparently, the described arrangements are only a part of the arrangements of the present disclosure, and not all arrangements. All other arrangements obtained by those of ordinary skill in the art based on some arrangements of the present disclosure are within the scope of the disclosure.

Figure 1:
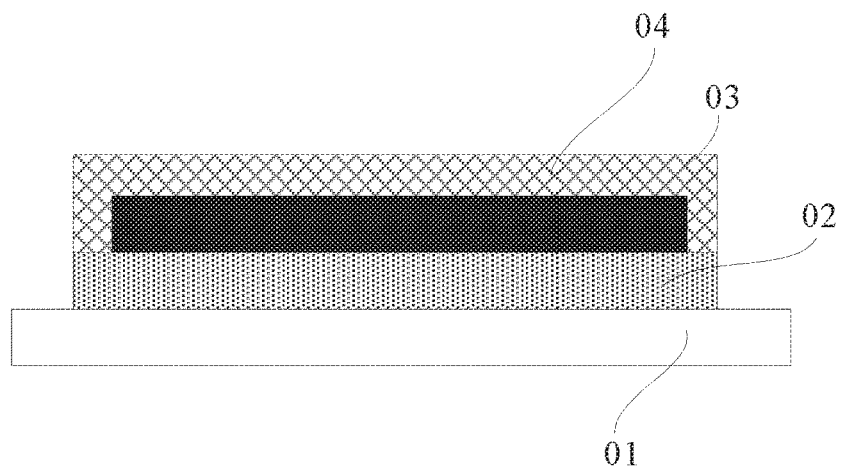
FIG. 1 is a schematic diagram of a display substrate according to the related art.
Figure 2:
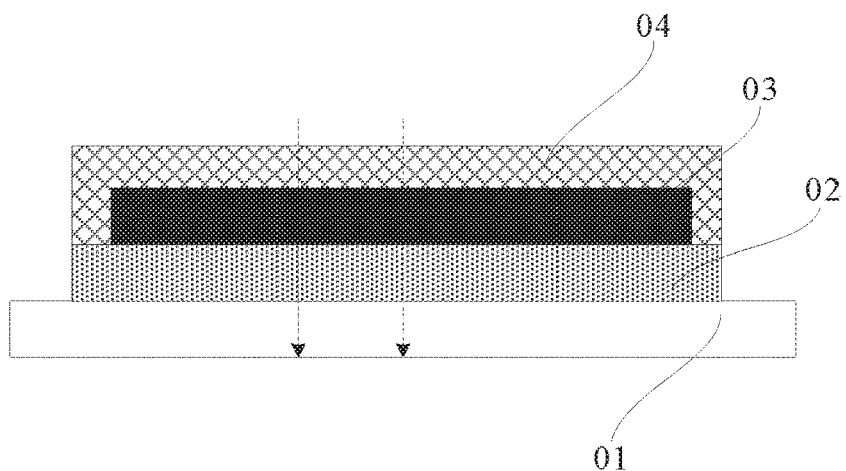
FIG. 2 is a schematic diagram of a display substrate before cutting according to the related art.
Figure 3:
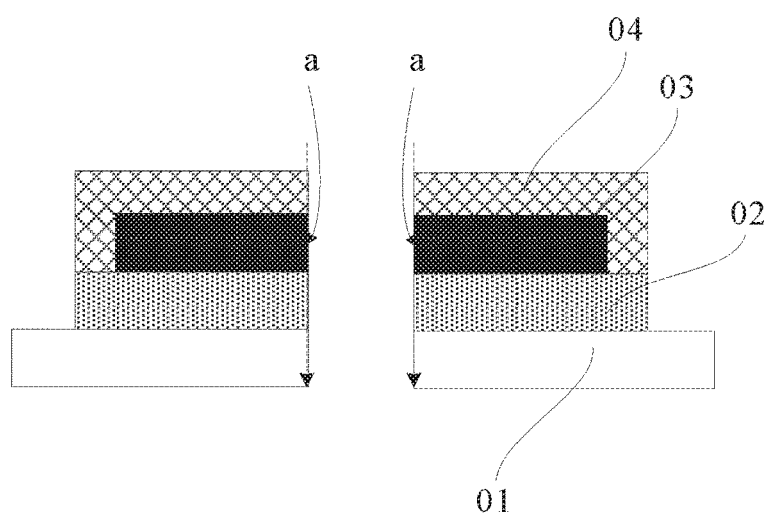
FIG. 3 is a schematic diagram of a display substrate after cutting according to the related art.

Referring to FIG. 1, an OLED display device in the related art generally includes a substrate 01, a thin film transistor (TFT) structure 02 disposed on the substrate 01, a self-luminescent layer 03 disposed on the TFT structure 02, and an encapsulation film 04 for the self-luminescent layer 03. When fabricating an OLED display device, sometimes it is necessary to cut a hole in a display area of the OLED display device to leave sufficient space for a camera, an earpiece, and the like. As shown in FIG. 2 and FIG. 3, when the area requiring a hole is cut, the cutting cross section a of the self-luminescent layer 03 in the OLED display device may be exposed to the external environment. Then, moisture and oxygen in the external environment may corrode and damage the self-luminescent layer 03, resulting in damage to the OLED display device.

Figure 4:
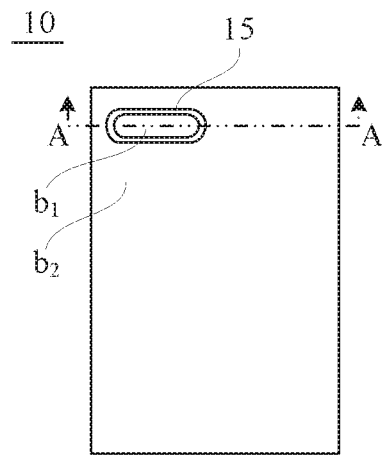
FIG. 4 is a schematic plan view of a display substrate according to some arrangements of the present disclosure.
Figure 5:
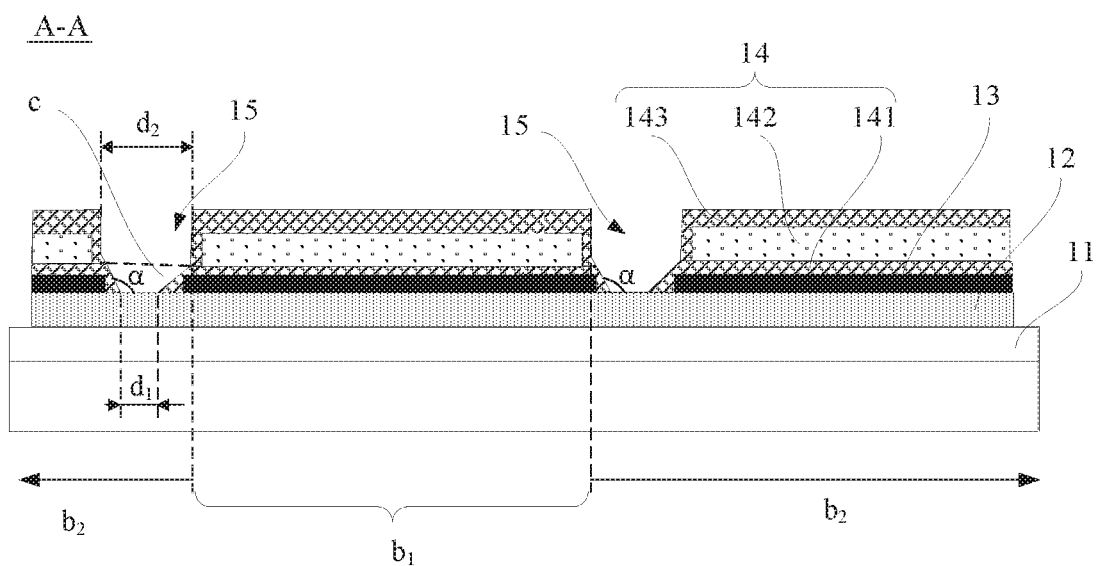
FIG. 5 is a cross sectional view of the display substrate in FIG. 4 taken along line A-A.

Referring to FIGS. 4 and 5, some arrangements of the present disclosure provide a display substrate 10 including a base substrate 11, a self-luminescent layer 13, and an encapsulation film layer 14. The self-luminescent layer 13 is disposed on a side of the base substrate 11, and the encapsulation film layer 14 is disposed on the side of the self-luminescent layer 13 away from the base substrate 11.

The display substrate 10 has a gap 15 penetrating through the self-luminescent layer 13 and the encapsulation film layer 14. The gap 15 separates the self-luminescent layer 13 and the encapsulation film layer 14 into at least two parts. As shown in FIG. 4 and FIG. 5, a part corresponds to a to-be-perforated area $b_1$ of the display substrate, and another part corresponds to a non-perforated area $b_2$ of the display substrate other than the to-be-perforated area.

Here, the manufacturing process, size, shape, and the like of the gap 15 are not limited, and can be configured by those skilled in the art according to actual conditions. As shown in FIG. 4, an orthogonal projection of the gap 15 on the base substrate 11 extends along the peripheral contour of the to-be-perforated area $b_1$. As shown in FIG. 5, the gap 15 is formed in the self-luminescent layer 13 and the encapsulation film layer 14, and the self-luminescent layer 13 are separated by the gap 15, so that when the display substrate is being perforated, that is, the to-be-perforated area $b_1$ is being cut along the gap 15 to form a hole, the self-luminescent layer 13 will not directly get cut, and no new cutting cross section will be produced in the self-luminescent layer 13.

The edge of the encapsulation film layer 14 adjacent to the gap 15 covers the side surface of the edge of the self-luminescent layer 13 adjacent to the edge of the gap 15. Thus it can block moisture and oxygen from entering the self-luminescent layer 13, protecting the self-luminescent layer 13 from moisture and oxygen after the display substrate is cut and perforated, and improving the reliability of the product.

In some arrangements, as shown in FIG. 5, the encapsulation film layer 14 includes a first inorganic barrier layer 141, an organic barrier layer 142, and a second inorganic barrier layer 143, and the first inorganic barrier layer 141, the organic barrier layer 142, and the second inorganic barrier layer 143 are sequentially disposed on the side of the self-luminescent layer 13 away from the base substrate 11.

The materials, manufacturing process, thickness and the like of the first inorganic barrier layer 141, the organic barrier layer 142, and the second inorganic barrier layer 143 are not limited herein, and can be configured by those skilled in the art according to actual conditions. For example, the first inorganic barrier layer 141 and the second inorganic barrier layer 143 can be formed by a method such as PECVD (Plasma Enhanced Chemical Vapor Deposition), ALD (Atomic Layer Deposition) or Sputter (sputter coating), and the organic barrier layer 142 can be formed by screen printing, printing, PECVD or the like.

Referring to FIG. 5, the edge of the first inorganic barrier layer 141 adjacent to the gap 15 covers the side surface of the edge of the self-luminescent layer 13 adjacent to the gap 15. Since the part of the self-luminescent layer 13 adjacent to the gap 15 is encapsulated by the first inorganic barrier layer 141, the first inorganic barrier layer 141 can desirably block moisture and oxygen from entering the self-luminescent layer 13. Thus it can protect the self-luminescent layer 13 from moisture and oxygen after the display substrate is perforated and thus can improve the reliability of the product.

Referring to FIG. 5, the edge of the second inorganic barrier layer 143 adjacent to the gap 15 covers the side surface of the edge of the organic barrier layer 142 adjacent to the gap 15. Since the part of the organic barrier layer 142 adjacent to the gap 15 is encapsulated by the second inorganic barrier layer 143, the second inorganic barrier layer 143 can desirably block moisture and oxygen. Thus it can protect the organic barrier layer 142 from moisture and oxygen after the display substrate is perforated and thus can improve the reliability of the product.

In some arrangements, as shown in FIG. 5, the width $d_1$ of the side of the gap 15 adjacent to the base substrate 11 is smaller than the width $d_2$ of the side of the gap 15 away from the base substrate. With this configuration, on the one hand, it can facilitate positioning a cutting tool in the process of cutting the to-be-perforated area $b_1$, thus preventing the cutting tool from cutting the non-perforated area $b_2$. On the other hand, the side surface of the edge of the self-luminescent layer 13 adjacent to the gap 15 can be covered by the encapsulation film layer 14 to protect the self-luminescent layer 13 from moisture and oxygen.

In some arrangements, as shown in FIG. 5, the part c of the cross section of the gap 15 adjacent to the base substrate 11 has a trapezoidal shape, and the width $d_1$ of the side of the trapezoidal shape adjacent to the base substrate 11 is smaller than the width $d_2$ of the side of the trapezoidal shape away from the base substrate 11. It should be noted that the cross section of the gap 15 is a cross section obtained by cutting the gap 15 in the width direction of the gap 15 and the direction perpendicular to the base substrate 11. Thus, the encapsulation film layer 14 can cover the side surface of the edge of the self-luminescent layer 13 adjacent to the gap 15, thus protecting the self-self-luminescent layer 13 from moisture and oxygen.

It should be noted that the trapezoidal shape is a trapezoid, or the trapezoidal shape is a quasi-trapezoidal shape. For example, the quasi-trapezoidal shape is obtained by replacing sharp corners of the trapezoid with rounded transition surfaces, or the quasi-trapezoidal shape is obtained by replacing straight sides of the trapezoid with curves.

In some arrangements, the angle α between the side of the trapezoidal shape and the bottom edge of the trapezoidal shape adjacent to the base substrate is 100° to 150°. In this way, the side surface of the edge of the self-luminescent layer 13 adjacent to the gap 15 can be more completely covered by the encapsulation film layer 14, thus it can improve the stability and reliability when the self-luminescent layer 13 is protected by the encapsulation film layer 14, and it can effectively protect the self-luminescent layer 13 from moisture and oxygen.

Figure 6:
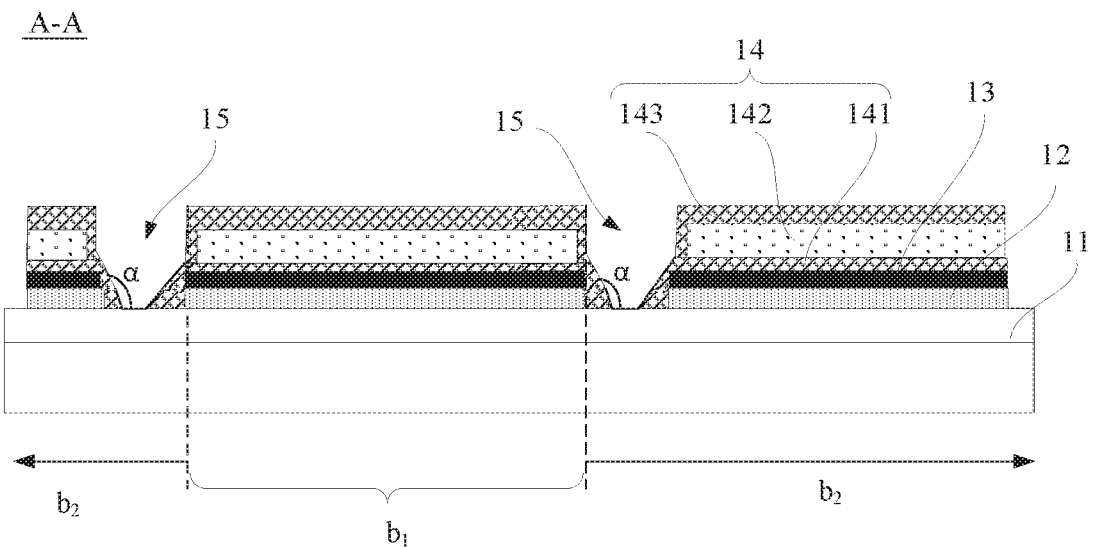
FIG. 6 is another cross sectional view of the display substrate in FIG. 4 taken along line A-A.

Referring to FIG. 4, FIG. 5 and FIG. 6, in some arrangements, the display substrate 10 further includes a thin film transistor structure layer 12 disposed between the base substrate 11 and the self-luminescent layer 13. It should be noted that the thin film transistor structure layer 12 refers to a driving circuit layer for driving the self-luminescent layer to emit light, and the driving circuit layer is a structure in which a plurality of film layers are overlapped, including but not limited to a thin film transistor array and a plurality of signal lines for connecting the thin film transistor array.

For example, as shown in FIG. 5, the side of the gap 15 adjacent to the base substrate 11 exposes the surface of the thin film transistor structure layer 12.

Alternatively, as shown in FIG. 6, the gap 15 penetrates through the thin film transistor structure layer 12 to expose the surface of the base substrate 11. In this case, the gap separates the thin film transistor structure layer 12 into at least two parts with a part corresponding to the to-be-perforated area $b_1$ and another part corresponding to the non-perforated area $b_2$. The edge of the encapsulation film layer 14 adjacent to the gap 15 covers the side surface of the edge of the thin film transistor structure layer 12 adjacent to the gap 15. In this way, it can block moisture and oxygen from entering the thin film transistor structure layer 12. Moreover, in the process of cutting the to-be-perforated area to form a hole, the thin film transistor structure layer 12 does not easily get cut, which is beneficial to protect the thin film transistor structure layer 12 from moisture and oxygen, thus improving reliability of the product.

Figure 7:
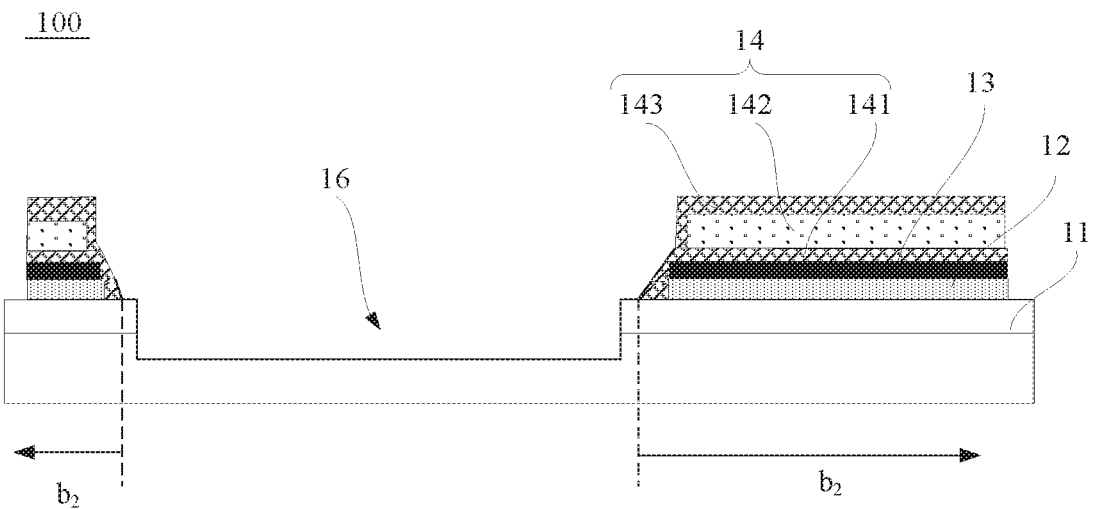
FIG. 7 is a schematic structural diagram of a display substrate after cutting according to some arrangements of the present disclosure.
Figure 8:
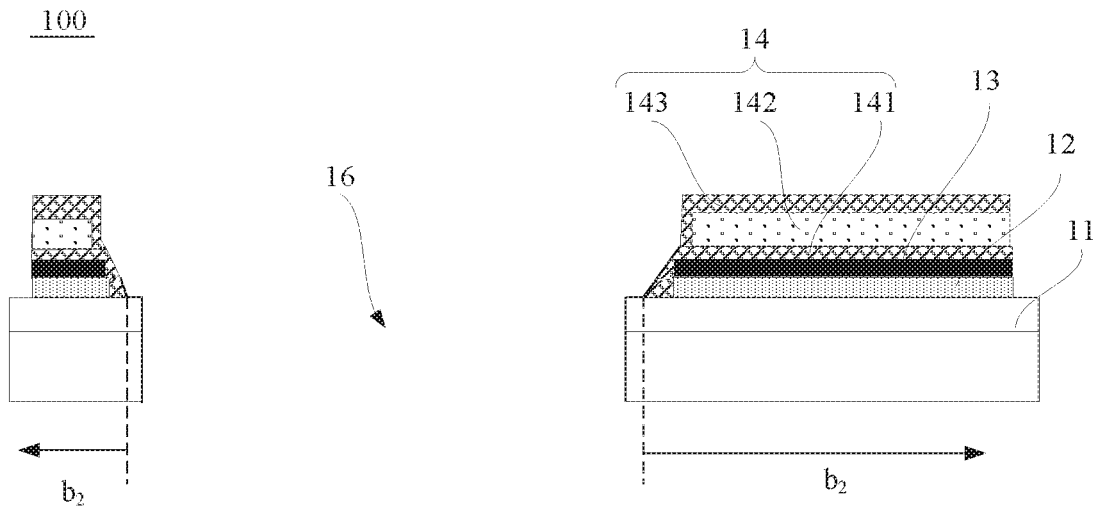
FIG. 8 is a schematic structural diagram of another display substrate after cutting according to some arrangements of the present disclosure.
Figure 9:
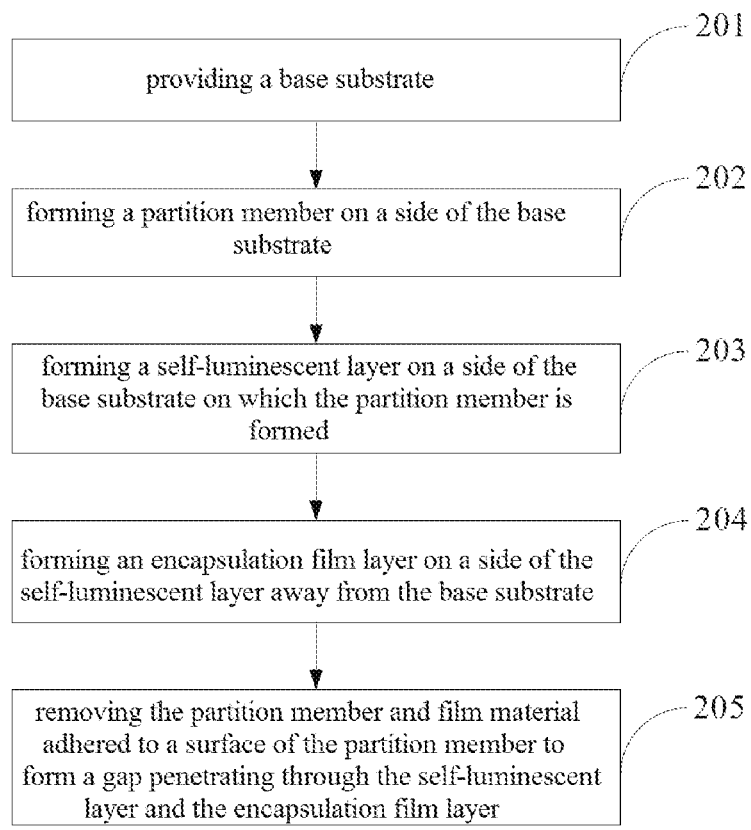
FIG. 9 is a schematic flow chart of a manufacturing method of a display substrate according to some arrangements of the present disclosure.
Figure 10:
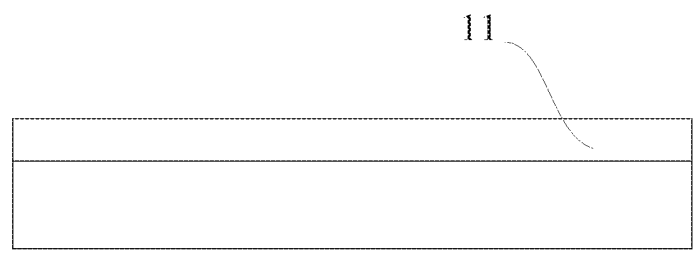
FIGS. 10 to 18 are schematic diagrams showing operations of a manufacturing method of a display substrate according to some arrangements of the present disclosure.

Referring to FIGS. 7 and 8, further arrangements of the present disclosure provide a display substrate after cutting 100, obtained by cutting the display substrate 10 along gap 15 thereof. The display substrate after cutting 100 includes a base substrate 11, a self-luminescent layer 13, and an encapsulation film layer 14. The self-luminescent layer 13 is disposed on a side of the base substrate 11, and the encapsulation film layer 14 is disposed on the side of the self-luminescent layer 13 away from the base substrate 11.

The display substrate after cutting 100 has a hole 16 penetrating through at least the encapsulation film layer 14 and the self-luminescent layer 13. For example, as shown in FIG. 7, the hole 16 is a blind hole that does not completely penetrate through the base substrate 11. Alternatively, as shown in FIG. 8, the hole 16 is a through hole penetrating through the base substrate 11.

The edge of the encapsulation film layer 14 adjacent to the hole 16 encapsulates the side surface of the edge of the self-luminescent layer 13 adjacent to the hole 16. Thus, when the to-be-perforated area $b_1$ is cut along the gap 15 to form the hole 16, the self-luminescent layer 13 does not get cut, and no new cutting surface is formed on the self-luminescent layer 13, thus protecting the self-luminescent layer 13 from moisture and oxygen.

In some arrangements, referring to FIG. 7 and FIG. 8, the display substrate after cutting 100 further includes a thin film transistor structure layer 12 disposed between the base substrate 11 and the self-luminescent layer 13. In one or more possible designs, the hole 16 may or may not penetrate through the thin film transistor structure layer 12.

Referring to FIG. 9 to FIG. 18, some arrangements of the present disclosure provide a manufacturing method of a display substrate. The manufacturing method includes the following operations.

In S201, a base substrate 11 is provided.

The base substrate 11 serves as support, so that the manufactured display substrate 10 can have high stability and reliability. The material of the base substrate 11 includes, but is not limited to, any one of sapphire, silicon or silicon carbide, and a suitable material can be selected as needed, which is not limited herein.

Figure 12:
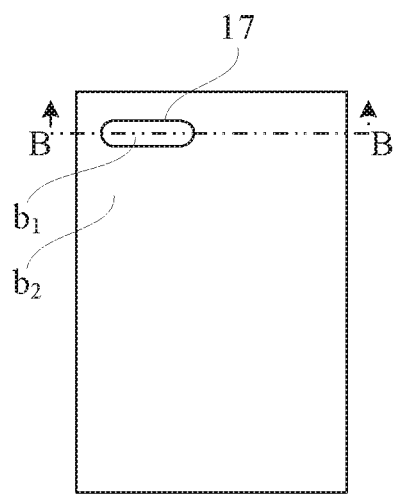
Figure 13:
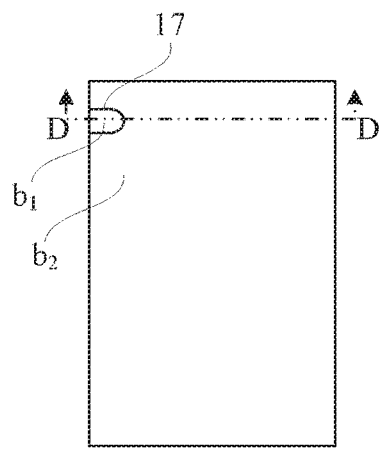
Figure 14:
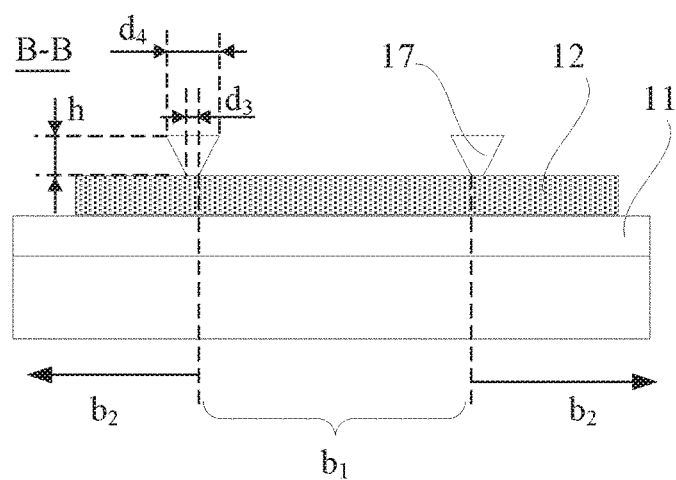

In S202, a partition member 17 is formed on a side of the base substrate 11. Referring to FIGS. 12 to 14, an orthogonal projection of the partition member 17 on the base substrate 11 extends along the peripheral contour of the to-be-perforated area $b_1$ of the display substrate 10. The width $d_3$ of the side of the partition member 17 adjacent to the base substrate 11 is smaller than the width $d_4$ of the side of the partition member 17 away from the base substrate 11. For example, as shown in FIG. 12, the partition member 17 is in a closed loop. Alternatively, as shown in FIG. 13, the partition member 17 has a partial ring that is not a closed loop.

The width of the partition member 17 refers to a dimension of the partition member 17 in the width direction thereof, which is a direction perpendicular to a tangent line to the outer contour of the projection of the partition member 17 on the base substrate 11.

Here, the material of the partition member 17 is not limited, as long as the partition member 17 does not react with other film layers and does not introduce new impurities. For example, the partition member 17 is made of a negative photoresist, which has the advantages of convenience and reliability.

The operation of fabricating the partition member 17 with a negative photoresist includes the following process.

In operation one, a negative photoresist layer is formed on the base substrate 11.

In operation two, the area of the negative photoresist layer where the partition member is to be formed is exposed.

In operation three, the exposed negative photoresist layer is developed to form the partition member 17.

Figure 15:
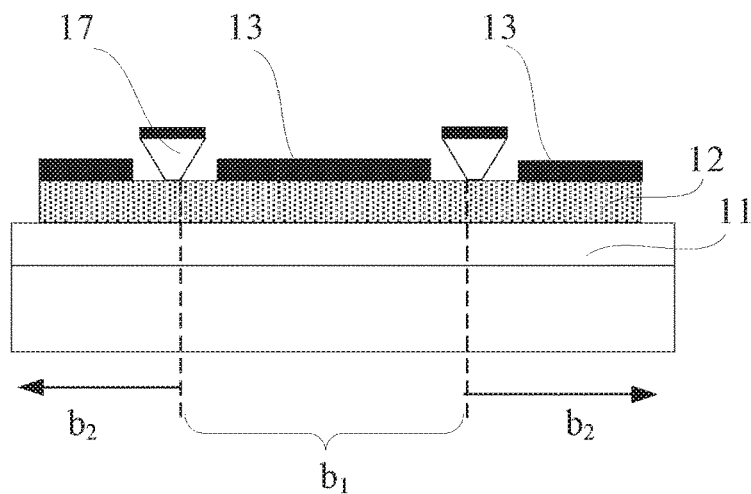

In this way, the partition member 17 having a cross section of a trapezoidal shape is formed on the base substrate, and moreover, the width of the side of the partition member 17 adjacent to the base substrate 11 can be made smaller than the width of the side thereof away from the base substrate 11, that is, an inverted trapezoidal shape can be formed on the base substrate 11, so that when the self-luminescent layer is subsequently formed, the self-luminescent layer 13 can be separated by the partition member 17, and as shown in FIG. 15, the part of the self-luminescent layer 13 which is located on the to-be-perforated area $b_1$ and the part of the self-luminescent layer 13 which is located on the non-perforated area $b_2$ are spaced apart. It should be noted that the cross section of the partition member 17 is a cross section obtained by cutting the partition member 17 in the width direction of the partition member 17 and the direction perpendicular to the base substrate 11.

It should be noted that the trapezoidal shape is a trapezoid, or the trapezoidal shape is a quasi-trapezoidal shape. For example, the quasi-trapezoidal shape is obtained by replacing sharp corners of the trapezoid with rounded transition surfaces, or the quasi-trapezoidal shape is obtained by replacing straight sides of the trapezoid with curves.

For example, referring to FIG. 14, the height h of the partition member is 1 μm to 10 μm. The difference between the width of the side of the partitioning member 17 away from the base substrate 11 and the width of the side of the partitioning member 17 adjacent to the base substrate 11 is greater than or equal to 0.5 μm, so that the partition member 17 can effectively separate the subsequently formed self-luminescent layer 13. Further, the circumferential dimension of the partition member 17 is not limited, and in practical use, the circumferential dimension of the partition member 17 is adapted to the circumferential dimension of the to-be-perforated area $b_1$. For example, when the partition member is annular, the larger the circumferential dimension of the to-be-perforated area $b_1$ is, and the larger the circumferential dimension of the partition member will be, so that the partition member 17 can extend along the outer contour of the to-be-perforated area $b_1$.

In S203, a self-luminescent layer 13 is formed on the side of the base substrate 11 where the partition member 17 is formed. As shown in FIG. 15, the self-luminescent layer 13 is separated into at least two parts by the partition member, one part of which is located in the to-be-perforated area $b_1$, and another part of which is located in the non-perforated area $b_2$ of the display substrate other than the to-be-perforated area.

The self-luminescent layer 13 can be fabricated by an evaporation process. Since the width $d_3$ of the side of the partition member 17 adjacent to the base substrate 11 is smaller than the width $d_4$ of the side of the partition member 17 away from the base substrate 11, when the self-self-luminescent layer 13 is formed, the partition member 17 can be utilized to effectively separate the self-luminescent layer 13, so that the part of the self-luminescent layer 13 which is located on the to-be-perforated area $b_1$ and the part of the self-luminescent layer 13 which is located on the non-perforated area $b_2$ are spaced apart.

In S204, an encapsulation film layer 14 is formed on a side of the self-luminescent layer 13 away from the base substrate 11.

Figure 16:
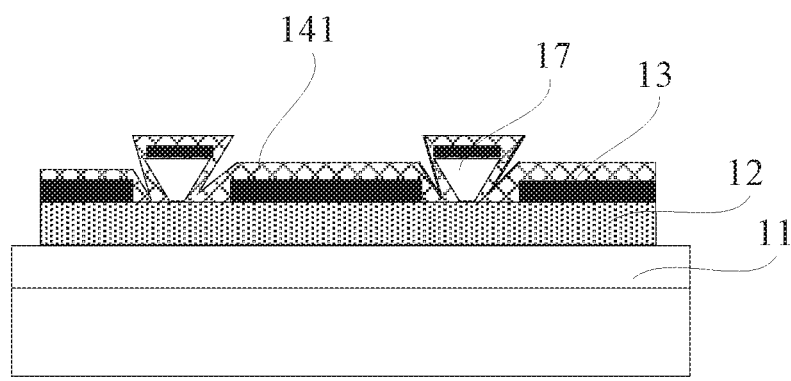
Figure 17:
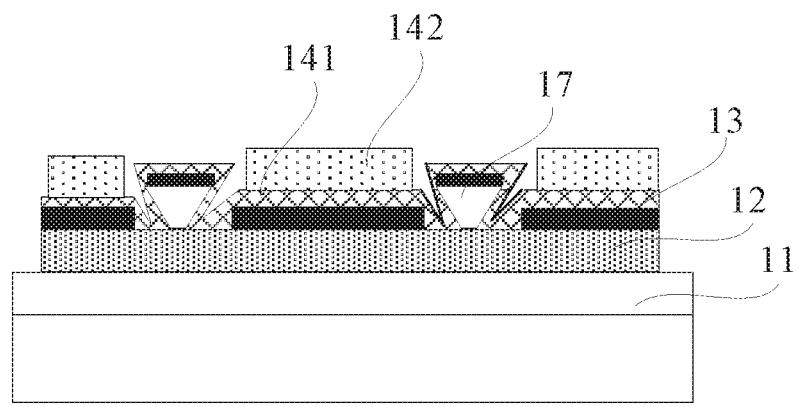
Figure 18:
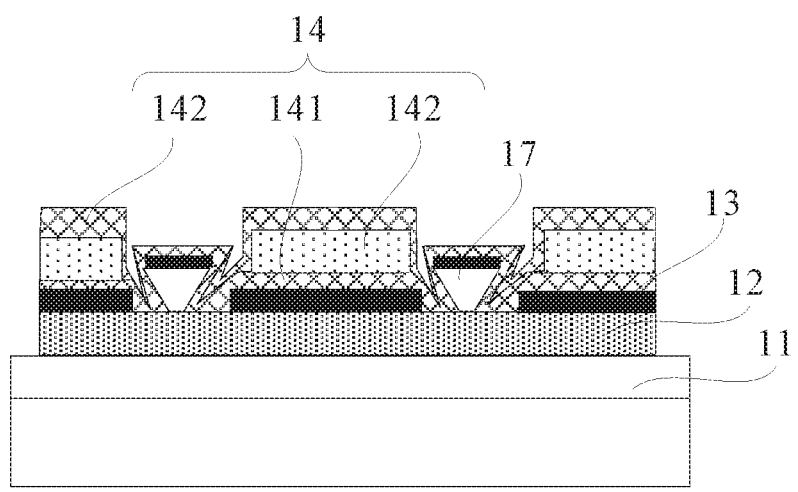

In some arrangements, referring to FIGS. 16-18, the encapsulation film layer 14 includes a first inorganic barrier layer 141, an organic barrier layer 142, and a second inorganic barrier layer 143. The process of forming the encapsulation film layer 14 on the side of the self-luminescent layer 13 away from the base substrate 11 includes the following operations.

In operation one, the first inorganic barrier layer 141 is formed on a side of the self-luminescent layer 13 away from the base substrate 11. The first inorganic barrier layer 141 covers the side surface of the edge of the self-luminescent layer 13 adjacent to the partition member 17, as shown in FIG. 16. In this way, it can block moisture and oxygen from entering the self-luminescent layer 13, thus protecting the self-luminescent layer 13 from moisture and oxygen after the display substrate is perforated, thus improving the reliability of the product. For example, the first inorganic barrier layer 141 is fabricated by a method such as CVD (e.g., PECVD), ALD, or Sputter. For example, the first inorganic barrier layer 141 is formed by a PECVD process, so that when the first inorganic barrier layer 141 is formed, the material of the first inorganic barrier layer 141 is deposited between the partition member 17 and the side surface of the edge of the self-luminescent layer 13 adjacent to the partition member 17, thus utilizing the first inorganic barrier layer 141 to effectively cover the side surface of the edge of the self-luminescent layer 13 adjacent to the partition member 17.

In operation two, an organic barrier layer 142 is formed on a side of the first inorganic barrier layer 141 away from the base substrate 11. The organic barrier layer 142 is located in an area of the display substrate 10 other than the area where the partition member 17 is located, as shown in FIG. 17. For example, the organic barrier layer 142 is fabricated by screen printing, printing, or CVD (e.g., PECVD). When the organic barrier layer is formed by screen printing or printing, the organic barrier layer 142 having the above pattern can be directly formed. When the organic barrier layer is formed by a chemical vapor deposition method such as PECVD, that is, plasma enhanced chemical vapor deposition, the organic barrier layer 142 having the above pattern can be formed using a mask.

It should be noted that the barrier property of the organic barrier layer 142 to moisture and oxygen is poor. If the organic barrier layer 142 is also formed on the partition member 17, a cutting surface will be formed on the organic barrier layer 142 when the partition member 17 is removed by a laser ablation process. The cutting surface will be degraded by moister and oxygen when being exposed to the outside environment. Therefore, when the organic barrier layer 142 is formed, the organic barrier layer 142 is not formed in the corresponding area above the partition member 17.

In operation three, a second inorganic barrier layer 143 is formed on a side of the organic barrier layer 142 away from the base substrate 11. The second inorganic barrier layer 143 covers the side surface of the edge of the organic barrier layer 142 adjacent to the partition member 17, as shown in FIG. 18. Thus, the second inorganic barrier layer 143 can be utilized to block moisture and oxygen from entering the organic barrier layer 142, thus protecting the organic barrier layer 142 from moisture and oxygen after the display substrate is perforated. At this time, the materials of the first inorganic barrier layer 141 and the second inorganic barrier layer 143 may encapsulate the disconnected surface of the self-luminescent layer 13 at the partition member 17, so that the self-luminescent layer 13 is protected from moisture and oxygen, thus improving the reliability of the product. For example, the second inorganic barrier layer 143 is fabricated by a method such as CVD (e.g., PECVD), ALD, or Sputter.

In S205, the partition member 17 and the film material adhered to the surface of the partition member 17 are removed, to form a gap 15 penetrating through the self-luminescent layer 13 and the encapsulation film layer 14, as shown in FIG. 5 and FIG. 6. Since the gap 15 penetrates through the self-luminescent layer 13 and the encapsulation film layer 14, when the display substrate is perforated, that is, when the to-be-perforated area $b_1$ is cut along the gap 15 to form a hole, the self-luminescent layer 13 will not directly get cut, and no new cutting surface will be formed on the self-luminescent layer 13, thus protecting the self-luminescent layer 13 from moisture and oxygen after the display substrate is perforated, and improving the reliability of the product.

There are various ways of removing the partition member 17 and the film material adhered to the surface of the partition member 17. For example, the partition member 17 and the film material adhered to the surface of the partition member 17 are removed by a laser ablation process. The material of the film layer adhered to the surface of the partition member 17 includes, but is not limited to, the materials of the self-luminescent layer 13 and the encapsulation film layer 14 that are formed on the surface of the partition member 17 during the fabrication of the self-luminescent layer 13 and the encapsulation film layer 14

In some arrangements, referring to FIG. 11 and FIGS. 14 to 18, before the operation of forming the partition member 17 on the side of the base substrate 11, the method further includes: forming a thin film transistor structure layer 12 on the side of the base substrate 11. At this time, the partition member 17 is formed on the side of the thin film transistor structure layer 12 away from the base substrate 11. Therefore, when the self-luminescent layer 13 is subsequently formed on the side of the thin film transistor structure layer 12 away from the base substrate 11, the partition member 17 can be utilized to separate the part of the self-luminescent layer 13 which is located on the to-be-perforated area $b_1$ and the part of the self-luminescent layer 13 which is located on the non-perforated area $b_2$.

Figure 11:
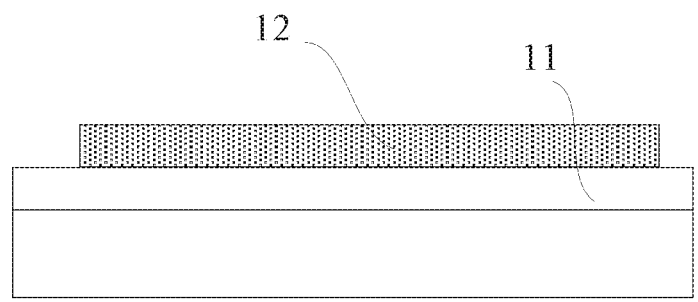

In other arrangements, referring to FIG. 6 and FIG. 11, after the operation of forming the partition member 17 on the side of the base substrate 11, the method further includes: forming a thin film transistor structure layer 12 on the side of the base substrate 11 where the partition member 17 is formed. At this time, since the thin film transistor structure layer 12 is formed after the partition member 17 has been formed, the formed thin film transistor structure layer 12 can be partitioned into at least two parts by the partitioning member 17, one part of which is located in the to-be-perforated area $b_1$ and another part of which is located in the non-perforated area $b_2$ other than the to-be-perforated area $b_1$. Further, after the encapsulation film layer 14 is formed subsequently, the encapsulation film layer 14 can cover the side surface of the edge of the thin film transistor structure layer 12 adjacent to the partition member 17. Therefore, when the display substrate is perforated, that is, when the to-be-perforated area $b_1$ is cut along the gap 15 formed after the partition member 17 is removed, to form a hole, the thin film transistor structure layer 12 will not directly get cut, and no new cutting surface will be formed on the thin film transistor structure layer 12, thus protecting the thin film transistor structure layer 12 from moisture and oxygen after the display substrate is perforated.

Figure 19:
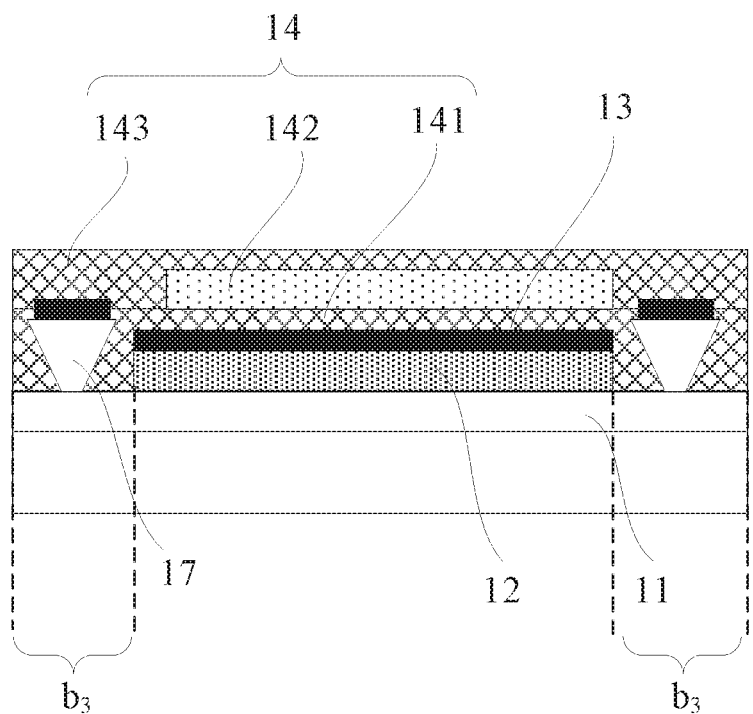
FIGS. 19 to 20 are schematic diagrams showing operations of another manufacturing method of a display substrate according to some arrangements of the present disclosure.
Figure 20:
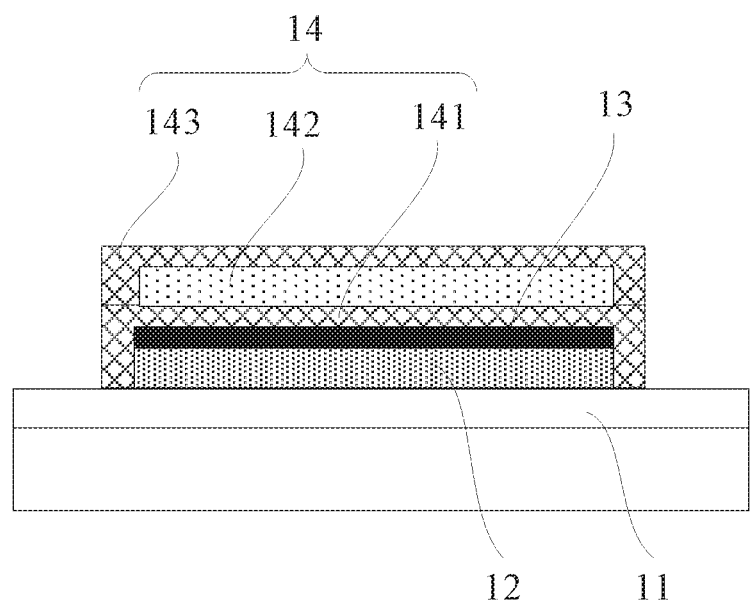

In one possible implementation, as shown in FIGS. 19 to 20, the partition member 17 is formed in an edge area $b_3$ of the display substrate 10. At this time, the cutting can be directly performed on the whole edge area $b_3$ of the display substrate 10.

In some arrangements, after the gap 15 is formed, the display substrate 10 is cut along the bottom of the gap 15 to form a hole 16 at the to-be-perforated area $b_1$ of the display substrate 10, as shown by the display substrate 100 after cutting in FIGS. 7 and 8. Thus, it can prevent the first inorganic barrier layer 141 and the second inorganic barrier layer 143 in the encapsulation film layer 14 from being cut during the cutting process, so that after the hole 16 is formed, the first inorganic barrier layer 141 and the second inorganic barrier layer 143 do not easily have cracks due to cutting, so that the encapsulation film layer 14 can effectively protect the self-luminescent layer 13 from moisture and oxygen after the display substrate is perforated, thus improving the reliability of the product.

Figure 21:
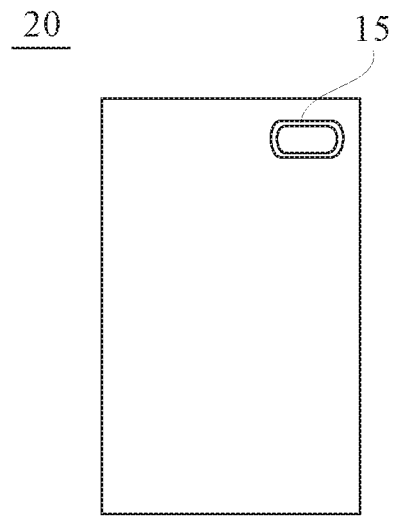
FIG. 21 is a schematic structural diagram of a display device according to some arrangements of the present disclosure.

Referring to FIG. 21, some arrangements of the present disclosure provide a display device 20 including any of the above-described display substrates 10. The display device 20 includes a gap 15, and in an area of the display device 20 defined by the gap 15, components such as a camera or an earpiece can be mounted.

Figure 22:
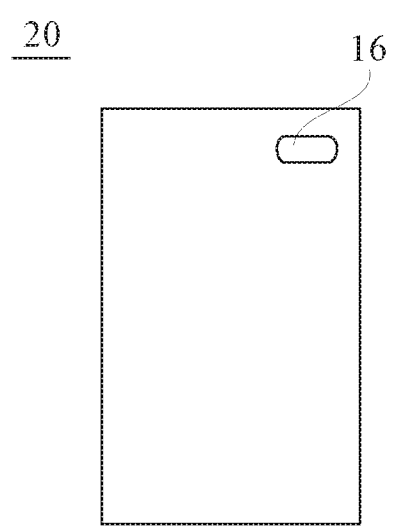
FIG. 22 is a schematic structural diagram of another display device according to some arrangements of the present disclosure.

Referring to FIG. 22, further arrangements of the present disclosure provide a display device 20 including any of the above-described display substrates after cutting 100. Since the display device 20 includes any of the above-described display substrates after cutting 100, and the display substrate after cutting 100 has the hole 16 penetrating through at least the encapsulation film layer 14 and the self-luminescent layer 13, and components such as a camera or an earpiece can be directly mounted in the hole 16.

It should be noted that the above display device 20 includes, but is not limited to, an organic electroluminescent diode display device.

The above is only specific arrangements of the present disclosure, but the scope of the present disclosure is not limited thereto, and any changes or substitutions easily contemplated by any person skilled in the art within the technical scope of the disclosure should fall within the scope of protection of the present disclosure. Therefore, the scope of protection of the present disclosure should be subject to the scope of the claims.

What is claimed is:

1. A display substrate, comprising:
   a base substrate; and
   an encapsulation display layer, comprising a self-luminescent layer disposed on a side of the base substrate, and an encapsulation film layer disposed on a side of the self-luminescent layer away from the base substrate, wherein:
      the display substrate has a gap, which penetrates through the self-luminescent layer and the encapsulation film layer, and separates the encapsulation display layer into at least two parts with a part corresponding to a to-be-perforated area of the display substrate and another part corresponding to a non-perforated area of the display substrate other than the to-be-perforated area;
      an edge of the encapsulation film layer adjacent to the gap covers a side surface of the self-luminescent layer adjacent to and facing the gap;
      the self-luminescent layer comprises a first part corresponding to the to-be-perforated area of the display substrate and a second part corresponding to the non-perforated area of the display substrate which are separated by the gap;
      a portion of a cross section of the gap between the first part and the second part of the self-luminescent layer and between a first surface of the self-luminescent layer adjacent to the base substrate and a second surface of the self-luminescent layer adjacent to the encapsulation film layer is in a trapezoidal shape, and a width of a side of the trapezoidal shape adjacent to the base substrate is smaller than a width of a side of the trapezoidal shape away from the base substrate; and
      the cross section of the gap is a cross section obtained by cutting the gap along a width direction of the gap and a direction perpendicular to the base substrate.

2. The display substrate according to claim 1, wherein the encapsulation film layer comprises a first inorganic barrier layer, an organic barrier layer and a second inorganic barrier layer, which are sequentially disposed on the side of the self-luminescent layer away from the base substrate;
   an edge of the first inorganic barrier layer adjacent to the gap covers the side surface of the self-luminescent layer adjacent to and facing the gap; and
   an edge of the second inorganic barrier layer adjacent to the gap covers a side surface of the organic barrier layer adjacent to and facing the gap.

3. The display substrate according to claim 1, wherein an angle between a side of the trapezoidal shape and a bottom side of the trapezoidal shape adjacent to the base substrate is 100° to 150°.

4. The display substrate according to claim 1, wherein an orthogonal projection of the gap on the base substrate extends along a peripheral contour of the to-be-perforated area.

5. The display substrate according to claim 1, further comprising:
   a thin film transistor structure layer disposed between the base substrate and the self-luminescent layer, wherein a side of the gap adjacent to the base substrate exposes a surface of the thin film transistor structure layer.

6. A display substrate, comprising:
   a base substrate;
   a self-luminescent layer disposed on a side of the base substrate; and
   an encapsulation film layer disposed on a side of the self-luminescent layer away from the base substrate, wherein:
      the display substrate has a hole, which at least penetrates through the encapsulation film layer and the self-luminescent layer;
      an edge of the encapsulation film layer adjacent to the hole covers a side surface of the self-luminescent layer adjacent to and facing the hole;
      the side surface of the self-luminescent layer comprises a first side surface and a second side surface which face each other through the hole;
      a portion of a cross section of the hole between the first side surface and the second side surface of the self-luminescent layer and between a first surface of the self-luminescent layer adjacent to the base substrate and a second surface of the self-luminescent layer adjacent to the encapsulation film layer is in a trapezoidal shape, and a width of a side of the trapezoidal shape adjacent to the base substrate is smaller than a width of a side of the trapezoidal shape away from the base substrate; and
      the cross section of the hole is a cross section obtained by cutting the hole along a width direction of the hole and a direction perpendicular to the base substrate.

7. A manufacturing method of the display substrate of claim 1, comprising:
   providing a base substrate;
   forming a partition member on a side of the base substrate, wherein an orthogonal projection of the partition member on the base substrate extends along a peripheral contour of a to-be-perforated area of the display substrate, and a width of a side of the partition member adjacent to the base substrate is smaller than a width of a side of the partition member away from the base substrate;
   forming a self-luminescent layer on the side of the base substrate on which the partition member is formed, wherein the self-luminescent layer is separated by the partition member into at least two parts with a part being in the to-be-perforated area and another part being in a non-perforated area of the display substrate other than the to-be-perforated area;

forming an encapsulation film layer on a side of the self-luminescent layer away from the base substrate; and removing the partition member and film material adhered to a surface of the partition member to form a gap penetrating through the self-luminescent layer and the encapsulation film layer, such that an edge of the encapsulation film layer adjacent to the gap covers a side surface of the self-luminescent layer adjacent to and facing the gap.

8. The manufacturing method according to claim 7, wherein forming a partition member on a side of the base substrate comprises:

forming a negative photoresist layer on the base substrate;

exposing an area of the negative photoresist layer where the partition member is to be formed; and developing the negative photoresist layer exposed to form the partition member.

9. The manufacturing method according to claim 8, wherein a cross section of the partition member is a trapezoidal shape, and the cross section of the partition member is a cross section obtained by cutting the partition member along a width direction of the partition member and a direction perpendicular to the base substrate.

10. The manufacturing method according to claim 7, wherein a difference between a width of a side of the partition member away from the base substrate and a width of a side of the partition member adjacent to the base substrate is greater than or equal to 0.5 μm.

11. The manufacturing method according to claim 7, wherein the partition member has a height of 1 μm to 10 μm.

12. The manufacturing method according to claim 7, wherein forming an encapsulation film layer on a side of the self-luminescent layer away from the base substrate comprises:

forming a first inorganic barrier layer on the side of the self-luminescent layer away from the base substrate, the first inorganic barrier layer covering a side surface of the self-luminescent layer adjacent to and facing the partition member;

forming an organic barrier layer on a side of the first inorganic barrier layer away from the base substrate, the organic barrier layer being located in an area of the display substrate other than the area where the partition member is located; and forming a second inorganic barrier layer on a side of the organic barrier layer away from the base substrate, the second inorganic barrier layer covering a side surface of the organic barrier layer adjacent to and facing the partition member.

13. The manufacturing method according to claim 12, wherein the self-luminescent layer is formed by an evaporation process, and the first inorganic barrier layer and the second inorganic barrier layer are formed by a chemical vapor deposition process.

14. The manufacturing method according to claim 7, wherein before forming a partition member on a side of the base substrate, the method further comprises: forming a thin film transistor structure layer on a side of the base substrate, wherein the partition member is formed on a side of the thin film transistor structure layer away from the base substrate.

15. The display substrate according to claim 6, wherein the display substrate is implemented in in a display device.

16. The display substrate according to claim 1, further comprising:

a thin film transistor structure layer disposed between the base substrate and the self-luminescent layer, wherein the gap penetrates through the thin film transistor structure layer to expose a surface of the base substrate, and separates the thin film transistor structure layer into at least two parts with a first part corresponding to the to-be-perforated area and a second part corresponding to the non-perforated area, and the edge of the encapsulation film layer adjacent to the gap covers a side surface of the thin film transistor structure layer adjacent to and facing the gap.

17. The display substrate according to claim 6, wherein the encapsulation film layer comprises a first inorganic barrier layer, an organic barrier layer and a second inorganic barrier layer, which are sequentially disposed on the side of the self-luminescent layer away from the base substrate;

an edge of the first inorganic barrier layer adjacent to the hole covers the side surface of the self-luminescent layer adjacent to and facing the hole; and an edge of the second inorganic barrier layer adjacent to the hole covers a side surface of the organic barrier layer adjacent to and facing the hole.

18. The manufacturing method according to claim 7, wherein after forming a partition member on a side of the base substrate, the method further comprises:

forming a thin film transistor structure layer on a side of the base substrate on which the partition member is formed, wherein the thin film transistor structure layer is separated into at least two parts by the partition member, with a part being located in the to-be-perforated area and another part being located in the non-perforated area of the display substrate other than the to-be-perforated area.

* * * * *